United States Patent

Kaneda

(10) Patent No.: US 10,476,473 B2
(45) Date of Patent: Nov. 12, 2019

(54) ELASTIC WAVE ELEMENT AND ELASTIC WAVE FILTER DEVICE

(71) Applicant: Murata Manufacturing Co., Ltd., Nagaokakyo-shi, Kyoto-fu (JP)

(72) Inventor: Akio Kaneda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/229,076

(22) Filed: Dec. 21, 2018

(65) Prior Publication Data

US 2019/0131955 A1    May 2, 2019

Related U.S. Application Data

(63) Continuation of application No. PCT/JP2017/016433, filed on Apr. 25, 2017.

(30) Foreign Application Priority Data

Jun. 24, 2016 (JP) ................ 2016-125626

(51) Int. Cl.
*H03H 9/02* (2006.01)
*H03H 9/145* (2006.01)
(Continued)

(52) U.S. Cl.
CPC .... *H03H 9/02992* (2013.01); *H03H 9/02275* (2013.01); *H03H 9/02921* (2013.01);
(Continued)

(58) Field of Classification Search
CPC .. H03H 9/02992; H03H 9/725; H03H 9/6483; H03H 9/02921; H03H 9/02275;
(Continued)

(56) References Cited

U.S. PATENT DOCUMENTS 7,474,034 B2 * 1/2009 Shindo ................ H03H 9/0585
 310/313 D
2011/0095844 A1 * 4/2011 Tanaka ................ H03H 9/0085
 333/133

(Continued)

FOREIGN PATENT DOCUMENTS

JP 7-303023 A 11/1995
JP 2012-65272 A 3/2012
JP 2014-143675 A 8/2014

OTHER PUBLICATIONS

Official Communication issued in International Patent Application No. PCT/JP2017/016433, dated Jun. 13, 2017.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave element includes a piezoelectric substrate, an IDT electrode including a first comb-shaped electrode and a second comb-shaped electrode, and reflectors. Each of the reflectors includes a first reflective busbar electrode, a second reflective busbar electrode, and reflective electrode fingers. The first comb-shaped electrode includes a first busbar electrode connected to the first reflective busbar electrodes, and first electrode fingers. The second comb-shaped electrode includes a second busbar electrode and second electrode fingers. In in-between areas, in each of which a reflective electrode finger and a first electrode finger adjacent to each other in the elastic-wave propagation direction face each other, connecting electrodes which electrically couple the reflective electrode fingers to the first electrode fingers are provided.

20 Claims, 6 Drawing Sheets

(51) Int. Cl.
*H03H 9/25* (2006.01)
*H03H 9/64* (2006.01)
*H03H 9/72* (2006.01)
*H03H 9/17* (2006.01)

(52) U.S. Cl.
CPC .......... *H03H 9/14541* (2013.01); *H03H 9/25* (2013.01); *H03H 9/6413* (2013.01); *H03H 9/6483* (2013.01); *H03H 9/725* (2013.01); *H03H 9/176* (2013.01)

(58) Field of Classification Search
CPC .... H03H 9/25; H03H 9/6413; H03H 9/14541; H03H 9/176
USPC .......................... 333/133, 193–196; 310/365
See application file for complete search history.

(56) References Cited

U.S. PATENT DOCUMENTS

2012/0068790 A1 3/2012 Yoshimoto
2015/0070227 A1 3/2015 Kishino et al.
2017/0244383 A1* 8/2017 Yasuda .................. H01Q 15/14

\* cited by examiner

COMPARATIVE EXAMPLE

ELASTIC WAVE ELEMENT AND ELASTIC WAVE FILTER DEVICE

CROSS REFERENCE TO RELATED APPLICATIONS

This application claims the benefit of priority to Japanese Patent Application No. 2016-125626 filed on Jun. 24, 2016 and is a Continuation Application of PCT Application No. PCT/JP2017/016433 filed on Apr. 25, 2017. The entire contents of each application are hereby incorporated herein by reference.

BACKGROUND OF THE INVENTION

1. Field of the Invention

The present invention relates to an elastic wave element including an IDT (interdigital transducer) electrode and a reflector, and an elastic wave filter device including the elastic wave element.

2. Description of the Related Art

Elastic wave filter devices including plural elastic wave elements have been commercially used in band-pass filters and other devices disposed in the front-end units of mobile communication devices.

As an example of such elastic wave elements, Japanese Unexamined Patent Application Publication No. 7-303023 discloses an elastic wave element including an IDT electrode and two reflectors disposed on both sides of the IDT electrode in the elastic-wave propagation direction. The IDT electrode includes a pair of busbar electrodes facing each other, and plural electrode fingers, each of which is connected to the corresponding electrode of the busbar electrode pair. Each reflector includes a pair of busbar electrodes facing each other, and plural electrode fingers connected to both of the electrodes of the busbar electrode pair.

In this elastic wave element, one of the busbar electrodes of the IDT electrode is connected to one of the busbar electrodes of each of the two reflectors. Thus, only one of the busbar electrodes of the IDT electrode is connected to the reflectors. Accordingly, the conditions of generation of reflected waves are the same, and in-phase standing waves are generated, thus improving the Q value of the elastic wave element.

A surge voltage may be applied, due to static electricity or the like, to an elastic wave element of the elastic wave filter device included in a mobile communication device. When a surge voltage is applied to an elastic wave element, discharge occurs between an electrode finger of the IDT electrode and an electrode finger of a reflector, which is adjacent to the electrode finger of the IDT electrode in the elastic-wave propagation direction. These electrode fingers may be deformed or lost.

In the elastic wave element disclosed in Japanese Unexamined Patent Application Publication No. 7-303023, the IDT electrode is connected to the reflectors using the busbar electrodes. Thus, the elastic wave element has a certain degree of voltage resistance. Nevertheless, when a surge voltage is applied, the electrode fingers may be deformed or destroyed due to an instantaneous potential difference occurring between the IDT electrode and the reflector. In particular, the higher the frequency is, the smaller the distance between the IDT electrode and the reflectors is. Therefore, an increasing necessity of protection from a surge voltage has arisen.

SUMMARY OF THE INVENTION

Preferred embodiments of the present invention provide improvements in voltage resistance of elastic wave elements.

An elastic wave element according to a preferred embodiment of the present invention includes a piezoelectric substrate, an IDT electrode, and a reflector. The IDT electrode is provided on the piezoelectric substrate and includes a first comb-shaped electrode and a second comb-shaped electrode. The first comb-shaped electrode and the second comb-shaped electrode face each other. The reflector is provided on the piezoelectric substrate and is disposed adjacent to the IDT electrode in an elastic-wave propagation direction. The reflector includes a first reflective busbar electrode, a second reflective busbar electrode, and a plurality of reflective electrode fingers. The first reflective busbar electrode and the second reflective busbar electrode extend in the elastic-wave propagation direction and face each other. The plurality of reflective electrode fingers are connected to the first reflective busbar electrode and the second reflective busbar electrode and extend in an orthogonal or substantially orthogonal direction to the elastic-wave propagation direction. The first comb-shaped electrode includes a first busbar electrode and a plurality of first electrode fingers. The first busbar electrode extends in the elastic-wave propagation direction and is connected to the first reflective busbar electrode. The plurality of first electrode fingers are connected to the first busbar electrode and extend in the orthogonal or substantially orthogonal direction. The second comb-shaped electrode includes a second busbar electrode and a plurality of second electrode fingers. The second busbar electrode extends in the elastic-wave propagation direction and is not connected to the second reflective busbar electrode. The plurality of second electrode fingers are connected to the second busbar electrode and extend in the orthogonal or substantially orthogonal direction. A connecting electrode is provided in an in-between area. The in-between area is an area in which a reflective electrode finger among the plurality of reflective electrode fingers faces a first electrode finger among the plurality of first electrode fingers. The reflective electrode finger is adjacent to the first electrode finger in the elastic-wave propagation direction. The connecting electrode electrically couples the reflective electrode finger to the first electrode finger.

Even when an instantaneous high voltage is applied to the elastic wave element, this configuration reduces or prevents the occurrence of discharge between the reflective electrode finger and the first electrode finger which are adjacent to each other. This improves the voltage resistance of the elastic wave element.

The connecting electrode may be provided in the entire or substantially the entire in-between area.

Accordingly, the occurrence of discharge is able to be reduced or prevented in the entire or substantially the entire in-between area, thus, improving the voltage resistance of the elastic wave element.

The first electrode finger includes a first intersecting electrode finger. A second electrode finger among the plurality of second electrode fingers includes a second intersecting electrode finger. The first intersecting electrode finger and the second intersecting electrode finger intersect each other when viewed in the elastic-wave propagation direction. The first electrode finger includes a first offset electrode finger disposed opposite to the second intersecting electrode finger in the orthogonal or substantially orthogonal direction. The second electrode finger includes a second offset electrode finger disposed opposite to the first intersecting electrode finger in the orthogonal or substantially orthogonal direction. The connecting electrode is provided between the reflective electrode finger and the first offset electrode finger.

Even when an instantaneous high voltage is applied to the elastic wave element, this configuration reduces or prevents the occurrence of discharge between the reflective electrode finger and the first offset electrode finger which are adjacent to each other. This improves the voltage resistance of the elastic wave element.

First spacing may be smaller than second spacing. The first spacing is between the reflective electrode finger and the first offset electrode finger. The reflective electrode finger and the first offset electrode finger are adjacent to each other in the elastic-wave propagation direction. The second spacing is between the first offset electrode finger and the first intersecting electrode finger. The first offset electrode finger and the first intersecting electrode finger are adjacent to each other in the elastic-wave propagation direction.

Accordingly, even when the spacing between the reflective electrode finger and the first offset electrode finger which are adjacent to each other in the elastic-wave propagation direction is small, the occurrence of discharge is reduced or prevented due to the connecting electrode disposed between the electrode fingers, thus improving the voltage resistance of the elastic wave element.

The first electrode finger includes a first intersecting electrode finger. A second electrode finger among the plurality of second electrode fingers includes a second intersecting electrode finger. The first intersecting electrode finger and the second intersecting electrode finger intersect each other when viewed in the elastic-wave propagation direction. The first electrode finger includes a first offset electrode finger disposed opposite to the second intersecting electrode finger in the orthogonal or substantially orthogonal direction. The second electrode finger includes a second offset electrode finger disposed opposite to the first intersecting electrode finger in the orthogonal or substantially orthogonal direction. The connecting electrode is provided between the reflective electrode finger and the first intersecting electrode finger.

Even when an instantaneous high voltage is applied to the elastic wave element, this configuration reduces or prevents to occurrence of discharge between the reflective electrode finger and the first intersecting electrode finger which are adjacent to each other. This improves the voltage resistance of the elastic wave element.

The first spacing may be smaller than the second spacing. The first spacing is between the reflective electrode finger and the first intersecting electrode finger. The reflective electrode finger and the first intersecting electrode finger are adjacent to each other in the elastic-wave propagation direction. The second spacing is between the first offset electrode finger and the first intersecting electrode finger. The first offset electrode finger and the first intersecting electrode finger are adjacent to each other in the elastic-wave propagation direction.

Even when an instantaneous high voltage is applied to the elastic wave element, this configuration reduces or prevents the occurrence of discharge between the reflective electrode finger and the first intersecting electrode finger which are adjacent to each other. This improves the voltage resistance of the elastic wave element.

The second busbar electrode may be disposed in a portion located in the orthogonal or substantially orthogonal direction from the first intersecting electrode finger that is electrically coupled to the reflective electrode finger.

Even when an instantaneous high voltage is applied to the elastic wave element, this configuration reduces or prevents the occurrence of discharge in the direction opposite to the first intersecting electrode finger because no offset electrode fingers are included in a portion located in the orthogonal or substantially orthogonal direction from the first intersecting electrode finger. This improves the voltage resistance of the elastic wave element.

The reflective electrode finger, the first electrode finger, and the connecting electrode may have an identical layer structure.

Accordingly, the reflective electrode finger, the first electrode finger, and the connecting electrode may be made in the same process, thus improving production of the elastic wave element.

The connecting electrode may extend from the first busbar electrode in the orthogonal or substantially orthogonal direction, and a leading end of the connecting electrode in the orthogonal or substantially orthogonal direction may have a round shape.

If the leading end of the connecting electrode has a round shape, even when an instantaneous high voltage is applied to the elastic wave element, discharge is difficult to occur. This improves the voltage resistance of the elastic wave element.

The first busbar electrode may receive a surge voltage.

Accordingly, even when the first busbar electrode receives a surge voltage, the occurrence of discharge is reduced or prevented, thus improving the voltage resistance of the elastic wave element.

An elastic wave filter device according to a preferred embodiment of the present invention includes an elastic wave element described above and an input/output terminal. The input/output terminal is connected to the first busbar electrode of the elastic wave element.

According to this configuration, even when an instantaneous high voltage is input from the input/output terminal to the first busbar electrode of the elastic wave element, the reflective electrode finger and the first electrode finger which are adjacent to each other are difficult to have different potentials, thus reducing or preventing the occurrence of discharge. This improves the voltage resistance of the elastic wave filter device.

An energization path length between the input/output terminal and the first electrode finger may be different from an energization path length between the input/output terminal and the reflective electrode finger.

Even when the energization path lengths are different from each other, the reflective electrode finger and the first electrode finger which are adjacent to each other are difficult to have different potentials, thus reducing or preventing the occurrence of discharge. This improves the voltage resistance of the elastic wave filter device.

Preferred embodiments of the present invention improve the voltage resistance of elastic wave elements.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A(a) is a plan view; FIG. 3A(b) is a cross section taken along A-A.

FIG. 3B(a) is a plan view; FIG. 3B(b) is a cross section taken along B-B.

DETAILED DESCRIPTION OF THE PREFERRED EMBODIMENTS

Preferred embodiments of the present invention will be described in detail below with reference to the accompanying drawings. Each of the preferred embodiments and their modified examples described below indicates a comprehensive or specific example. For example, values, shapes, materials, components, the arrangement and connection structure of the components which are indicated in the preferred embodiments and their modified examples are exemplary, and are not intended to limit the present invention. Among the components in the preferred embodiments and their modified examples below, components that are not described in the independent claims are described as optional components. The size or the size ratio of a component illustrated in drawings is not necessarily strict.

First Preferred Embodiment

An elastic wave element according to a first preferred embodiment of the present invention includes an IDT (interdigital transducer) electrode and reflectors. The elastic wave element is preferably used, for example, as a filter (a band-pass filter, a low-pass filter, a high-pass filter, or a band elimination filter) of a mobile communication device, such as a cellular phone. Before the elastic wave element according to the present preferred embodiment is described, an issue of elastic wave elements will be described with reference to a drawing.

Figure 1:
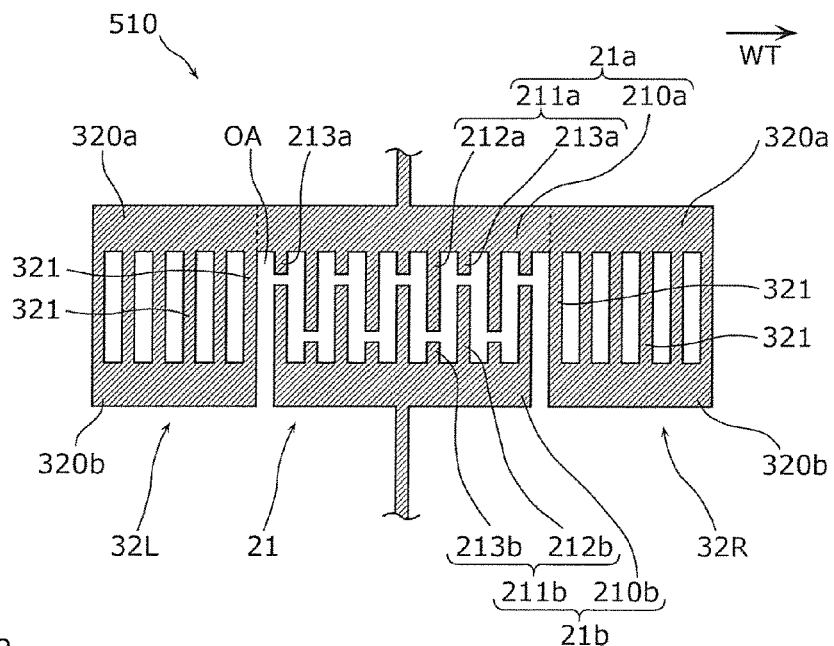
FIG. 1 is a plan view of an elastic wave element according to a comparative example.

FIG. 1 is a plan view of an elastic wave element 510 according to a comparative example.

The elastic wave element 510 according to the comparative example includes an IDT electrode 21 and reflectors 32L and 32R disposed on both sides of the IDT electrode 21 in the elastic-wave propagation direction.

Each of the reflectors 32L and 32R includes reflective busbar electrodes 320a and 320b facing each other, and a plurality of reflective electrode fingers 321.

The IDT electrode 21 includes comb-shaped electrodes 21a and 21b facing each other.

The comb-shaped electrode 21a of the comb-shaped electrodes includes a busbar electrode 210a and a plurality of electrode fingers 211a. The electrode fingers 211a include intersecting electrode fingers 212a and offset electrode fingers 213a. The other comb-shaped electrode 21b includes a busbar electrode 210b and a plurality electrode fingers 211b. The electrode fingers 211b include intersecting electrode fingers 212b and offset electrode fingers 213b.

The busbar electrode 210a included in the comb-shaped electrode 21a of the comb-shaped electrodes is connected to the reflective busbar electrodes 320a and 320a included in the reflective busbar electrode pairs of the reflectors 32L and 32R, respectively. In the elastic wave element 510 according to the comparative example, even when a surge voltage is applied, this structure enables the potentials between the IDT electrode 21 and the reflector 32L to be equal or substantially equal and the potentials between the IDT electrode 21 and the reflector 32R to be equal or substantially equal, thus ensuring a certain degree of voltage resistance.

However, when a surge voltage is applied, an offset electrode finger 213a and a reflective electrode finger 321 which are adjacent to each other in the elastic-wave propagation direction WT may be deformed or destroyed. This may be because the difference in distance from the input/output terminal through which a surge voltage is input causes the offset electrode finger 213a and the reflective electrode finger 321 to instantaneously have different potentials, leading to the occurrence of discharge in an in-between area OA in which the offset electrode finger 213a faces the reflective electrode finger 321.

In the present preferred embodiment, an elastic wave element having a voltage resistance such that a voltage received, for example, in the case in which a surge voltage is applied may be withstood, and an elastic wave filter device including the elastic wave element will be described.

Figure 2:
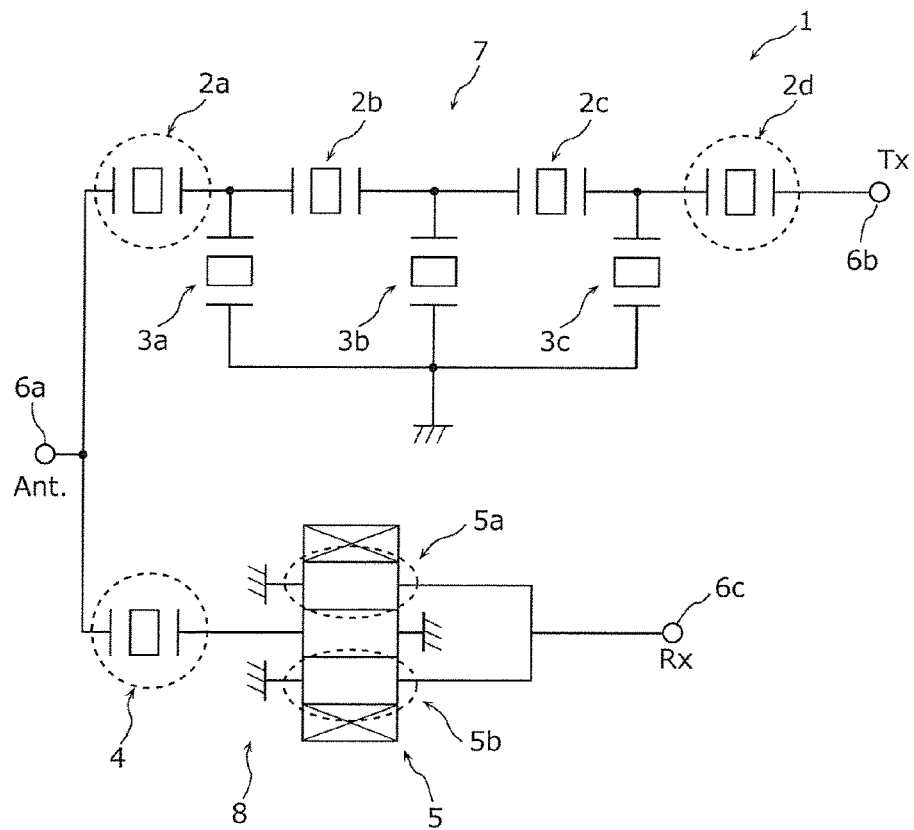
FIG. 2 is a diagram illustrating the circuit configuration of an elastic wave filter device according to a first preferred embodiment of the present invention.

FIG. 2 is a diagram illustrating the circuit configuration of an elastic wave filter device 1 according to the first preferred embodiment.

As illustrated in FIG. 2, the elastic wave filter device 1 includes a transmit filter 7, a receive filter 8, an input/output terminal 6a on the antenna side, an input/output terminal 6b on the transmitter side, and an input/output terminal 6c on the receiver side. Each of the transmit filter 7 and the receive filter 8 is coupled, with its leads bundled together, to the input/output terminal 6a on the antenna side.

The transmit filter 7 is a band-pass filter that filters transmission waves, which are received from the input/output terminal 6b on the transmitter side, in accordance with the corresponding transmit passbands, and that outputs the resulting waves to the input/output terminal 6a on the antenna side. The receive filter 8 is a band-pass filter that filters receiving waves, which are received from the input/output terminal 6a on the antenna side, in accordance with the corresponding receive passbands and that outputs the resulting waves to the input/output terminal 6c on the receiver side.

The transmit filter 7, which is a ladder filter, includes series resonators 2a, 2b, 2c, and 2d and parallel resonators 3a, 3b, and 3c. The series resonators 2a, 2b, 2c, and 2d, are disposed in the path coupling the input/output terminal 6a on the antenna side to the input/output terminal 6b on the transmitter side. The parallel resonators 3a, 3b, and 3c are coupled between the coupling path from the series resonator 2a to the series resonator 2d and a reference terminal (ground). The receive filter 8 includes a series resonator 4 and a longitudinally-coupled elastic wave filter unit 5 which are disposed in the path coupling the input/output terminal 6a on the antenna side to the input/output terminal 6c on the receiver side.

The elastic wave element according to the present preferred embodiment has voltage resistance, and is preferably used, for example, as the series resonators 2a and 4 coupled to the input/output terminal 6a on the antenna side, as the series resonator 2d coupled to the input/output terminal 6b at the transmitter side, and as resonators 5a and 5b of the longitudinally-coupled elastic wave filter unit 5 coupled to the input/output terminal 6c at the receiver side. This configuration causes the elastic wave filter device 1 to have voltage resistance to an instantaneous high voltage received from the input/output terminals 6a to 6c.

The circuit configuration is not limited to the above-described configuration. In addition, the elastic wave element according to the present preferred embodiment may be used as the other series resonators 2b and 2c or the other parallel resonators 3a to 3c. The elastic wave element will be described in detail below.

Figure 3A:
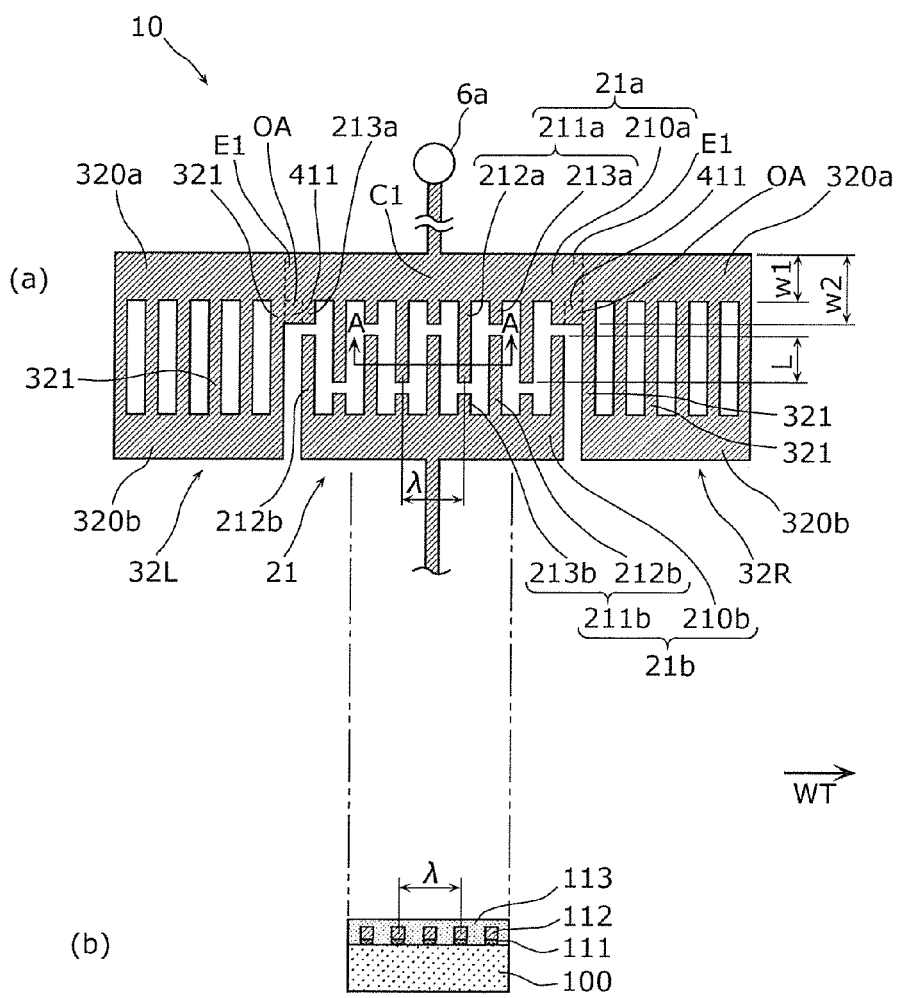
FIG. 3A includes diagrams illustrating an elastic wave element according to the first preferred embodiment of the present invention.
Figure 3B:
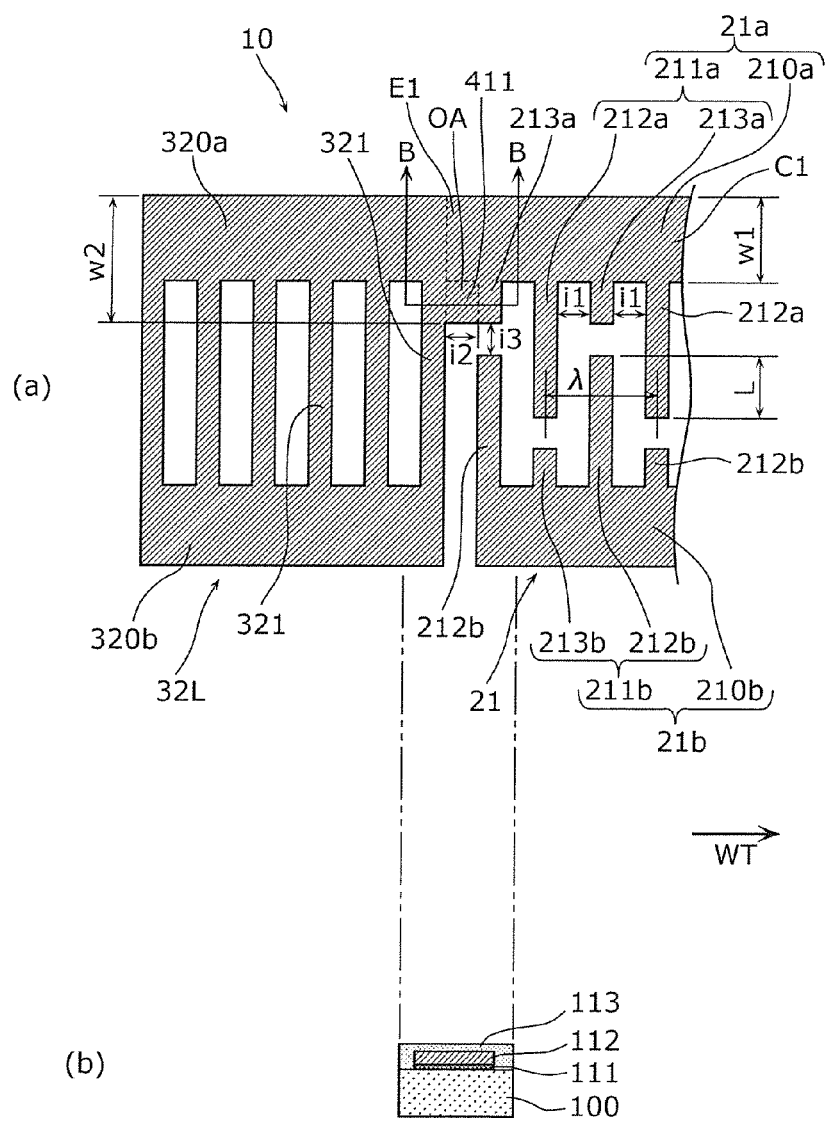
FIG. 3B includes partially-enlarged views of the elastic wave element in FIG. 3A.

FIG. 3A includes diagrams illustrating an elastic wave element 10 according to the first preferred embodiment. FIG. 3A(a) is a plan view. FIG. 3A(b) is a cross section taken along A-A. FIG. 3B includes partially-enlarged views of the elastic wave element 10.

As illustrated in FIG. 3A, the elastic wave element 10 includes a piezoelectric substrate 100, the IDT electrode 21 disposed on the piezoelectric substrate 100, and the reflectors 32L and 32R disposed on the piezoelectric substrate 100 and disposed adjacent to the IDT electrode 21 in the elastic-wave propagation direction WT.

The piezoelectric substrate 100 is preferably made, for example, of LiTaO$_3$ piezoelectric single crystal, LiNbO$_3$ piezoelectric single crystal, which have a given cut-angle, or piezoelectric ceramic.

As illustrated in FIG. 3A(a), the IDT electrode 21 includes a pair of the first comb-shaped electrode 21a and the second comb-shaped electrode 21b facing each other. The first comb-shaped electrode 21a includes first intersecting electrode fingers 212a, and the second comb-shaped electrode 21b includes the second intersecting electrode fingers 212b. The first intersecting electrode fingers 212a intersect the second intersecting electrode fingers 212b when viewed in the elastic-wave propagation direction WT.

As illustrated in FIG. 3A(b), the IDT electrode 21 has a layered structure including an adhesive layer 111 and a main electrode layer 112. Similarly to the IDT electrode 21, the reflectors 32L and 32R also have the layered structure including the adhesive layer 111 and the main electrode layer 112.

The cross sectional structure of the IDT electrode 21 and the reflectors 32L and 32R will be described below.

The adhesive layer 111 improves the adhesiveness between the piezoelectric substrate 100 and the main electrode layer 112, and, for example, Ti is preferably used of the adhesive layer 111. The film thickness of the adhesive layer 111 is preferably, for example, about 12 nm. For example, Al including about 1% of Cu is preferably used as the material of the main electrode layer 112. The film thickness of the main electrode layer 112 is preferably, for example, about 162 nm. The protective layer 113 covers the IDT electrode 21. The protective layer 113 protects the main electrode layer 112 from the external environment, adjusts the frequency-temperature characteristics, and improves the moisture resistance, and is a film whose main component is preferably, for example, silicon dioxide.

Design parameters of the IDT electrode 21 will be described below. The wave length of the elastic wave element 10 is defined by using the repeated pitch λ of the first intersecting electrode fingers 212a and the second intersecting electrode fingers 212b included in the first comb-shaped electrode 21a and the second comb-shaped electrode 21b, respectively, illustrated in FIG. 3A(a). The intersecting width L of the IDT electrode 21 is the electrode finger length in which the first intersecting electrode fingers 212a overlap the second intersecting electrode fingers 212b when viewed in the elastic-wave propagation direction WT. The number N of pairs indicates the number of pairs of first intersecting electrode fingers 212a and second intersecting electrode fingers 212b. In the present preferred embodiment, preferably, for example, the repeated pitch λ=about 2 μm, the intersecting width L=about 50 μm, and the number N of pairs=100.

The configuration of electrodes on the piezoelectric substrate 100 of the elastic wave element 10 will be described below. As described above, the elastic wave element 10 includes the piezoelectric substrate 100, the IDT electrode 21, and the reflectors 32L and 32R. The reflectors 32L and 32R are disposed on both side of the IDT electrode 21 in the elastic-wave propagation direction WT.

Each of the reflectors 32L and 32R includes the first reflective busbar electrode 320a, the second reflective busbar electrode 320b, and the plurality of reflective electrode fingers 321.

The first reflective busbar electrode 320a and the second reflective busbar electrode 320b extend in the elastic-wave propagation direction WT, and face each other.

The reflective electrode fingers 321 are each connected to the first reflective busbar electrode 320a and the second reflective busbar electrode 320b, and extend in the direction (hereinafter referred to as the orthogonal direction CD) orthogonal or substantially orthogonal to the elastic-wave propagation direction WT. The reflective electrode fingers 321 are parallel or substantially parallel to each other at intervals.

The first comb-shaped electrode 21a of the IDT electrode 21 includes the first busbar electrode 210a and the plurality of first electrode fingers 211a. The first busbar electrode 210a extends in the elastic-wave propagation direction WT. The first electrode fingers 211a are connected to the first busbar electrode 210a and extend in the orthogonal or substantially orthogonal direction CD.

The second comb-shaped electrode 21b of the IDT electrode 21 includes the second busbar electrode 210b and the plurality of second electrode fingers 211b. The second busbar electrode 210b extends in the elastic-wave propagation direction WT. The second electrode fingers 211b are connected to the second busbar electrode 210b and extend in the orthogonal or substantially orthogonal direction CD.

The first busbar electrode 210a is connected to the first reflective busbar electrodes 320a of the reflectors 32L and 32R. In contrast, the second busbar electrode 210b is not connected to the reflectors 32L or 32R.

The first busbar electrode 210a is directly connected to the input/output terminal 6a through which a surge voltage is input. The first reflective busbar electrodes 320a are connected to the input/output terminal 6a with the first busbar electrode 210a interposed therebetween. The energization path length between the input/output terminal 6a and a first electrode finger 211a is different from the energization path length between the input/output terminal 6a and a reflective electrode finger 321. In the present preferred embodiment, the energization path length between the input/output terminal 6a and the reflective electrode finger 321 is preferably longer than the energization path length between the input/output terminal 6a and the first electrode finger 211a (a first offset electrode finger 213a described below).

The first electrode fingers 211a include the first intersecting electrode fingers 212a and the first offset electrode fingers 213a. The second electrode fingers 211b include the second intersecting electrode fingers 212b and the second offset electrode fingers 213b.

As described above, the first intersecting electrode fingers 212a and the second intersecting electrode fingers 212b intersect each other when viewed in the elastic-wave propagation direction WT.

The first offset electrode fingers 213a are shorter than the first intersecting electrode fingers 212a and face the second intersecting electrode fingers 212b in the orthogonal or substantially orthogonal direction CD. The second offset electrode fingers 213b are shorter than the second intersecting electrode fingers 212b and face the first intersecting electrode fingers 212a in the orthogonal direction CD. The comb-shaped electrodes 21a and 21b include the offset electrode fingers 213a and the offset electrode fingers 213b, respectively. Thus, for example, spurious emissions which are unnecessary frequency components caused by a harmonic, for example, are avoided.

First offset electrode fingers 213a are disposed on both ends of the first busbar electrode 210a in the elastic-wave propagation direction WT. That is, each first offset electrode finger 213a is adjacent to the corresponding reflective electrode finger 321 in the elastic-wave propagation direction WT.

The spacing i2 between the reflective electrode finger 321 and the first offset electrode finger 213a which are adjacent to each other in the elastic-wave propagation direction WT is smaller than the spacing i1 between a first offset electrode finger 213a and a first intersecting electrode finger 212a which are adjacent to each other in the elastic-wave propagation direction WT (see FIG. 3B(a)). For example, the spacing i2 is preferably smaller than the spacing i1 by about 0.005 μm. The spacing i2 is smaller than the spacing i3 between a first offset electrode finger 213a and a second intersecting electrode finger 212b which face each other in the orthogonal or substantially orthogonal direction CD. For example, the spacing i2 is preferably smaller than the spacing i3 by about 0.005 μm.

In the present preferred embodiment, in the area corresponding to the spacing i2 described above, that is, in the entire in-between area OA in which the reflective electrode finger 321 and the first offset electrode finger 213a adjacent to each other face each other, a connecting electrode 411 is provided. The connecting electrode 411 electrically couples the reflective electrode finger 321 and the first offset electrode finger 213a adjacent to each other.

The connecting electrode 411 is provided in the same process (for example, the lift-off technology) as the reflective electrode fingers 321 and the first offset electrode fingers 213a. That is, the reflective electrode finger 321 and the first offset electrode finger 213a, which are adjacent to each other, and the connecting electrode 411 disposed in between are a unified body, and, as illustrated in FIG. 3B(b), have the same layered structure.

In the elastic wave element 10 according to the present preferred embodiment, in the in-between area OA in which the reflective electrode finger 321 and the first offset electrode finger 213a adjacent to each other in the elastic-wave propagation direction WT face each other, the connecting electrode 411 which electrically couples the reflective electrode finger 321 to the first offset electrode finger 213a is provided.

This configuration makes it difficult for the reflective electrode finger 321 and the first offset electrode finger 213a adjacent to each other to have different potentials even when an instantaneous high voltage is applied to the elastic wave element 10, thus reducing or preventing the occurrence of discharge. This improves the voltage resistance of the elastic wave element 10.

The elastic wave filter device 1 according to the present preferred embodiment includes the elastic wave element 10 and an input/output terminal (for example, the input/output terminal 6a). The input/output terminal is connected to the first busbar electrode 210a of the elastic wave element 10.

This configuration makes it difficult for the reflective electrode finger 321 and the first offset electrode finger 213a adjacent to each other to have different potentials even when an instantaneous high voltage is input from the input/output terminal (for example, the input/output terminal 6a) to the first busbar electrode 210a of the elastic wave element 10, thus reducing or preventing the occurrence of discharge. This improves the voltage resistance of the elastic wave filter device 1.

In the present preferred embodiment, the configuration in which the connecting electrode 411 which electrically couples the reflective electrode finger 321 to the first offset electrode finger 213a is disposed in the in-between area OA is described. When the first offset electrode finger 213a and the connecting electrode 411 are defined by a unified body, the present preferred embodiment may be described as follows without explicitly illustrating the first offset electrode finger 213a and the connecting electrode 411.

That is, in the elastic wave element 10 according to the present preferred embodiment, the first busbar electrode 210a includes both end portions E1 in contact with the respective first reflective busbar electrodes 320a of the reflectors 32L and 32R. The width w2 of the end portions E1 of the first busbar electrode 210a is larger than the width w1 of a center portion C1. Each end portion E1 extends, in the elastic-wave propagation direction WT, from the contact point with the first reflective busbar electrode 320a to the position at which the second intersecting electrode finger 212b is disposed. Thus, the wide end portion E1 of the first busbar electrode 210a is connected to the first reflective busbar electrode 320a. Thus, even when a surge voltage is input, the electric field does not concentrate in the end portion E1 of the first busbar electrode 210a, thus, improving the voltage resistance.

Figure 4:
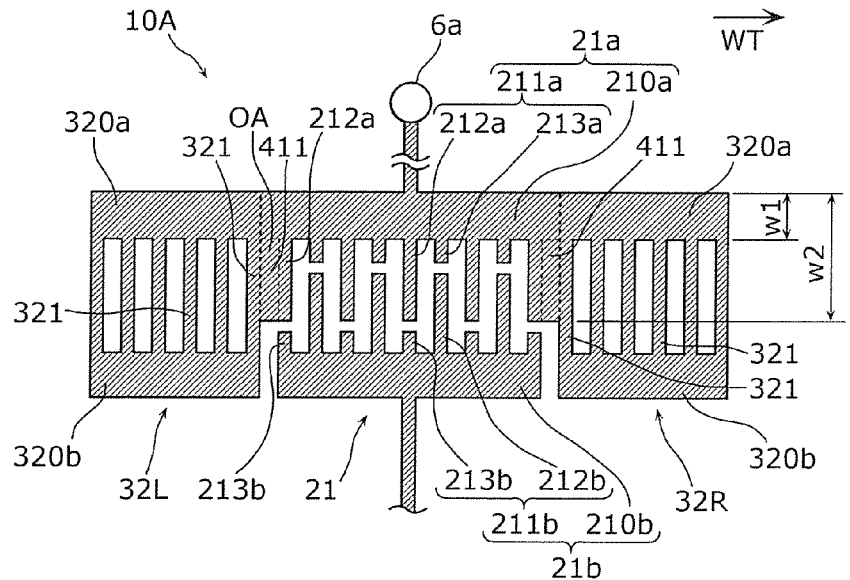
FIG. 4 is a plan view of an elastic wave element according to a first modified example of the first preferred embodiment of the present invention.

FIG. 4 is a plan view of an elastic wave element 10A according to a first modified example of the first preferred embodiment.

In the elastic wave element 10A according to the first modified example, first intersecting electrode fingers 212a are disposed on both sides of the first busbar electrode 210a in the elastic-wave propagation direction WT. That is, each first intersecting electrode finger 212a and a reflective electrode finger 321 are adjacent to each other in the elastic-wave propagation direction WT.

In the elastic wave element 10A, a connecting electrode 411, which electrically couples the reflective electrode finger 321 to the first intersecting electrode finger 212a, is provided in an in-between area OA in which the reflective electrode finger 321 and the first intersecting electrode finger 212a adjacent to each other in the elastic-wave propagation direction WT face each other.

According to the configuration, even when an instantaneous high voltage is applied to the elastic wave element 10A, the reflective electrode finger 321 and the first intersecting electrode finger 212a which are adjacent to each other are unlikely to have different potentials, thus reducing or preventing the occurrence of discharge. This improves the voltage resistance of the elastic wave element 10A.

In the elastic wave element 10A, the spacing between the reflective electrode finger 321 and the first intersecting electrode finger 212a which are adjacent to each other in the elastic-wave propagation direction WT is smaller than the spacing between a first offset electrode finger 213a and a first intersecting electrode finger 212a which are adjacent to each other in the elastic-wave propagation direction WT. The spacing between the reflective electrode finger 321 and the first intersecting electrode finger 212a is smaller than the spacing between a first intersecting electrode finger 212a and a second offset electrode fingers 213b facing each other in the orthogonal or substantially orthogonal direction CD.

Figure 5:
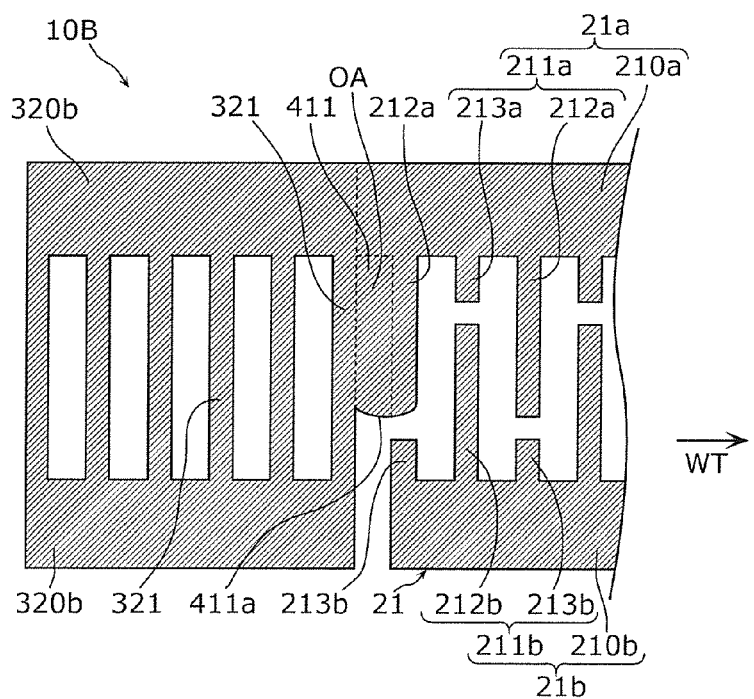
FIG. 5 is a plan view of an enlarged portion of an elastic wave element according to a second modified example of the first preferred embodiment of the present invention.

FIG. 5 is a plan view of an enlarged portion of an elastic wave element 10B according to a second modified example of the first preferred embodiment.

In the elastic wave element 10B according to the second modified example, the connecting electrodes 411 extend from the first busbar electrode 210a in the orthogonal or substantially orthogonal direction CD, and leading ends 411a of the connecting electrodes 411 in the orthogonal or substantially orthogonal direction CD preferably have a round shape. Specifically, the leading end 411a of each connecting electrode 411 and the leading end of the first intersecting electrode finger 212a adjacent to the connecting electrode 411 preferably have a round shape.

This configuration in which the leading ends 411a of the connecting electrodes 411 have a round shape causes discharge to be difficult to occur even when an instantaneous high voltage is applied to the elastic wave element 10B. This improves the voltage resistance of the elastic wave element 10B.

Second Preferred Embodiment

Figure 6:
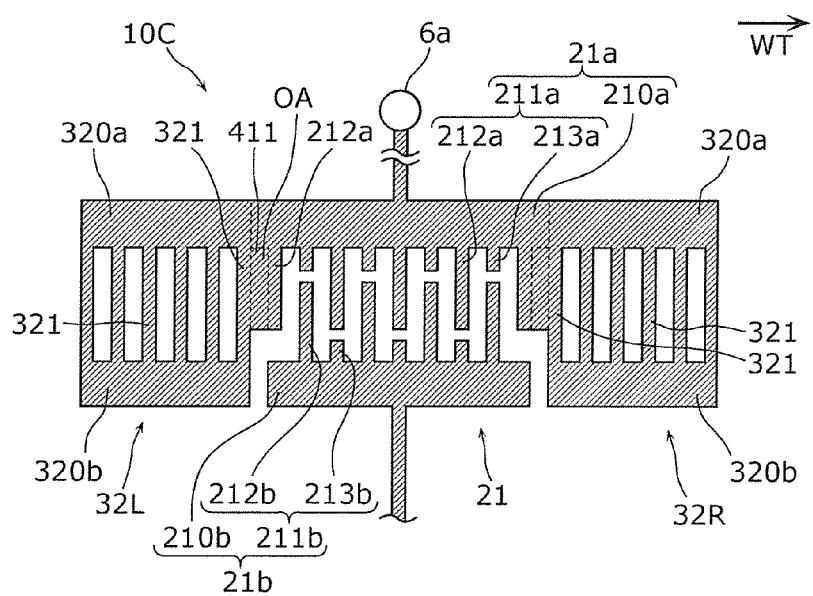
FIG. 6 is a plan view of an elastic wave element according to a second preferred embodiment of the present invention.

FIG. 6 is a plan view of an elastic wave element 10C according to a second preferred embodiment of the present invention.

The elastic wave element 10C according to the second preferred embodiment is different from the elastic wave element 10A according to the first modified example in that a second offset electrode finger is not disposed in a portion located in the orthogonal or substantially orthogonal direction CD from the first intersecting electrode finger 212a which is electrically coupled to the reflective electrode finger 321, and in that, instead, the second busbar electrode 210b is provided. Thus, the distance between the first intersecting electrode finger 212a and the electrode positioned opposite the first intersecting electrode finger 212a is longer compared with the elastic wave element 10A according to the first modified example.

This configuration enables the occurrence of discharge in the direction opposite to the first intersecting electrode finger 212a to be reduced or prevented even when an instantaneous high voltage is applied to the elastic wave element 10C. This improves the voltage resistance of the elastic wave element 10C.

Third Preferred Embodiment

Figure 7:
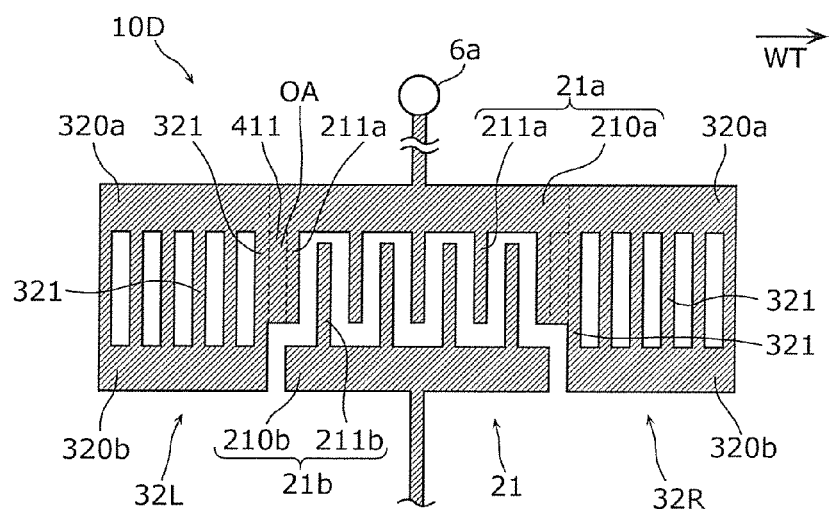
FIG. 7 is a plan view of an elastic wave element according to a third preferred embodiment of the present invention.

FIG. 7 is a plan view of an elastic wave element 10D according to a third preferred embodiment of the present invention.

The elastic wave element 10D according to the third preferred embodiment is different from the elastic wave element 10A according to the first modified example in that the first comb-shaped electrode 21a and the second comb-shaped electrode 21b do not include the offset electrode fingers 213a and the offset electrode fingers 213b, respectively. That is, the first comb-shaped electrode 21a includes the first intersecting electrode fingers 212a and the first busbar electrode 210a. The second comb-shaped electrode 21b includes the second intersecting electrode fingers 212b and the second busbar electrode 210b.

Since the offset electrode fingers are not included in a portion located in the orthogonal or substantially orthogonal direction CD from the first intersecting electrode fingers 212a, this configuration enables the occurrence of discharge in the direction opposite to the first intersecting electrode fingers 212a to be reduced or prevented even when an instantaneous high voltage is applied to the elastic wave element 10D. This improves the voltage resistance of the elastic wave element 10D.

Fourth Preferred Embodiment

Figure 8:
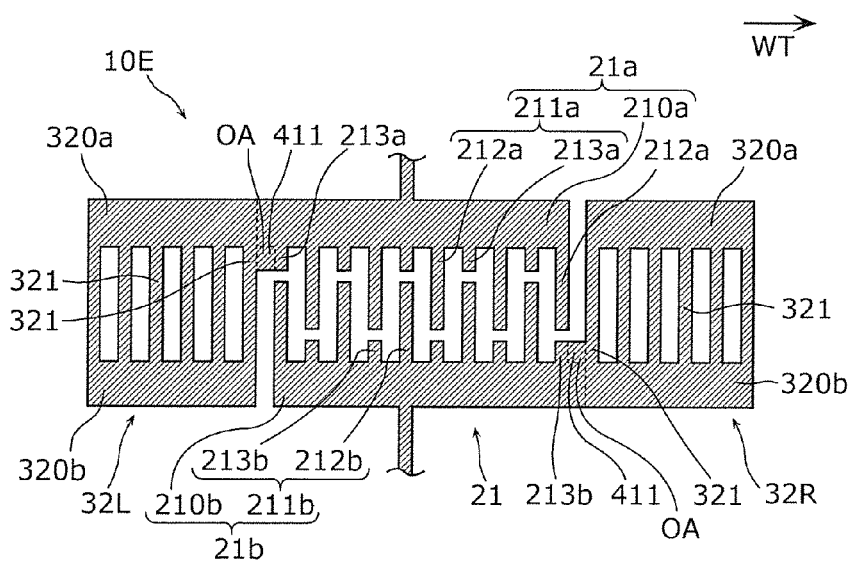
FIG. 8 is a plan view of an elastic wave element according to a fourth preferred embodiment of the present invention.

FIG. 8 is a plan view of an elastic wave element 10E according to a fourth preferred embodiment of the present invention.

The elastic wave element 10E according to the fourth preferred embodiment is different from the elastic wave element 10 according to the first preferred embodiment in that the first busbar electrode 210a of the first comb-shaped electrode 21a is not connected to the first reflective busbar electrode 320a of the reflector 32R and is connected only to the first reflective busbar electrode 320a of the reflector 32L.

According to this configuration, the reflective electrode finger 321 and the first offset electrode finger 213a adjacent to each other are difficult to have different potentials even when an instantaneous high voltage is applied to the elastic wave element 10E, thus reducing or preventing the occurrence of discharge. This improves the voltage resistance of the elastic wave element 10E.

In FIG. 8, the second busbar electrode 210b is connected to the second reflective busbar electrode 320b of the reflector 32R, and a connecting electrode 411 is provided in an in-between area OA between a reflective electrode finger 321 and a second offset electrode finger 213b which are adjacent to each other in the elastic-wave propagation direction WT. In this case, the description made by replacing the second busbar electrode 210b receiving an instantaneous high voltage with the first busbar electrode 210a and by replacing the second offset electrode finger 213b with the first offset electrode finger 213a shows that the elastic wave element 10E achieves advantageous effects that are the same as or similar to that described above.

The elastic wave elements and the elastic wave filter devices according to the preferred embodiments and their modified examples of the present invention are described above. The present invention is not limited to the preferred embodiments and their modified examples described above. For example, preferred embodiments obtained by making the following changes to the preferred embodiments and their modified examples described above are encompassed in the present invention.

For example, the elastic wave element 10 is not limited to a surface acoustic wave element, and may be a boundary acoustic wave element.

The materials of the adhesive layer 111, the main electrode layer 112, and the protective layer 113 are not limited to the materials described above. The IDT electrode 21 does not necessarily have the layered structure described above. The IDT electrode 21 may be made, for example, of a metal, such as Ti, Al, Cu, Pt, Au, Ag, or Pd, or an alloy, or may be made of a plurality of layered bodies made of the metals or the alloy described above. The protective layer 113 is not necessarily provided.

The piezoelectric substrate 100 may have a layered structure in which a high-acoustic-velocity support substrate, a low-acoustic-velocity film, and a piezoelectric film are laminated in this sequence. The piezoelectric film is preferably made, for example, of 50° Y cut X SAW propagation LiTaO$_3$ piezoelectric single crystal or piezoelectric ceramic (lithium tantalate single crystal, which is cut along a plane having a normal rotated by about 50° from the Y axis around the X axis, or ceramic; in the single crystal or the ceramic, surface acoustic waves propagate in the X axis direction). The piezoelectric film preferably has, for example, a thickness of about 600 nm. The high-acoustic-velocity support substrate is a substrate which supports the low-acoustic-velocity film, the piezoelectric film, and the IDT electrode. The high-acoustic-velocity support substrate is a substrate in which the acoustic velocity of bulk waves in the high-acoustic-velocity support substrate is higher than elastic waves, such as surface acoustic waves or boundary waves, which propagate in the piezoelectric film. The high-acoustic-velocity support substrate functions such that surface acoustic waves are confined in a portion, in which the piezoelectric film and the low-acoustic-velocity film are laminated, and do not leak to a portion lower than the high-acoustic-velocity support substrate. The high-acoustic-velocity support substrate is preferably, for example, a silicon substrate, and has, for example, a thickness of about 200 µm. The low-acoustic-velocity film is a film in which the acoustic velocity of bulk waves in the low-acoustic-velocity film is lower than that of bulk waves propagating in the piezoelectric film. The low-acoustic-velocity film is disposed between the piezoelectric film and the high-acoustic-velocity support substrate. Leakage of the energy of surface acoustic waves to the outside of the IDT electrode is reduced or prevented due to this configuration and the property in which the energy of elastic waves naturally concentrates in a medium having a low acoustic velocity. The low-acoustic-velocity film is preferably a film, for example, whose main component is silicon dioxide, and has, for example, a thickness of about 670 nm. This layered structure enables the Q values in the resonant frequency and the anti-resonant frequency to be greatly improved compared with the structure in which the piezoelectric substrate 100 is used as a single layer. That is, a surface acoustic wave resonator having a high Q value may be provided. Thus, the surface acoustic wave resonator may be used to define a filter whose insertion loss is small.

Preferred embodiments of the present invention may be widely used, for example, in mobile communication devices, such as cellular phones, as a radio-frequency filter, a duplexer, and a multiplexer which resists application of a high voltage, such as a surge voltage.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave element comprising:
a piezoelectric substrate;
an IDT electrode provided on the piezoelectric substrate and including a first comb-shaped electrode and a second comb-shaped electrode, the first comb-shaped electrode and the second comb-shaped electrode facing each other; and
a reflector provided on the piezoelectric substrate and disposed adjacent to the IDT electrode in an elastic-wave propagation direction; wherein
the reflector includes a first reflective busbar electrode, a second reflective busbar electrode, and a plurality of reflective electrode fingers;
the first reflective busbar electrode and the second reflective busbar electrode extend in the elastic-wave propagation direction and face each other;
the plurality of reflective electrode fingers are connected to the first reflective busbar electrode and the second reflective busbar electrode and extend in an orthogonal or substantially orthogonal direction to the elastic-wave propagation direction;
the first comb-shaped electrode includes a first busbar electrode and a plurality of first electrode fingers;
the first busbar electrode extends in the elastic-wave propagation direction and is connected to the first reflective busbar electrode;
the plurality of first electrode fingers are connected to the first busbar electrode and extend in the orthogonal direction;
the second comb-shaped electrode includes a second busbar electrode and a plurality of second electrode fingers;
the second busbar electrode extends in the elastic-wave propagation direction and is connected to the second reflective busbar electrode;
the plurality of second electrode fingers are connected to the second busbar electrode and extend in the orthogonal direction;
a connecting electrode is provided in an in-between area that is an area in which a reflective electrode finger among the plurality of reflective electrode fingers faces a first electrode finger among the plurality of first electrode fingers;
the reflective electrode finger is adjacent to the first electrode finger in the elastic-wave propagation direction;
the connecting electrode electrically couples the reflective electrode finger to the first electrode finger.
2. The elastic wave element according to claim 1, wherein the connecting electrode is provided in an entirety or substantially an entirety of the in-between area.
3. The elastic wave element according to claim 1, wherein the first electrode finger includes a first intersecting electrode finger;
a second electrode finger among the plurality of second electrode fingers includes a second intersecting electrode finger;
the first intersecting electrode finger and the second intersecting electrode finger intersect each other when viewed in the elastic-wave propagation direction;
the first electrode finger includes a first offset electrode finger disposed opposite to the second intersecting electrode finger in the orthogonal or substantially orthogonal direction;
the second electrode finger includes a second offset electrode finger disposed opposite to the first intersecting electrode finger in the orthogonal or substantially orthogonal direction; and the connecting electrode is provided between the reflective electrode finger and the first offset electrode finger.

4. The elastic wave element according to claim 3, wherein a first spacing is smaller than a second spacing;
the first spacing is between the reflective electrode finger and the first offset electrode finger;
the reflective electrode finger and the first offset electrode finger are adjacent to each other in the elastic-wave propagation direction;
the second spacing is between the first offset electrode finger and the first intersecting electrode finger; and
the first offset electrode finger and the first intersecting electrode finger are adjacent to each other in the elastic-wave propagation direction.

5. The elastic wave element according to claim 1, wherein
the first electrode finger includes a first intersecting electrode finger;
a second electrode finger among the plurality of second electrode fingers includes a second intersecting electrode finger;
the first intersecting electrode finger and the second intersecting electrode finger intersect each other when viewed in the elastic-wave propagation direction;
the first electrode finger includes a first offset electrode finger disposed opposite to the second intersecting electrode finger in the orthogonal or substantially orthogonal direction;
the second electrode finger includes a second offset electrode finger disposed opposite to the first intersecting electrode finger in the orthogonal or substantially orthogonal direction; and
the connecting electrode is provided between the reflective electrode finger and the first intersecting electrode finger.

6. The elastic wave element according to claim 5, wherein
a first spacing is smaller than a second spacing;
the first spacing is between the reflective electrode finger and the first offset electrode finger;
the reflective electrode finger and the first offset electrode finger are adjacent to each other in the elastic-wave propagation direction;
the second spacing is between the first offset electrode finger and the first intersecting electrode finger; and
the first offset electrode finger and the first intersecting electrode finger are adjacent to each other in the elastic-wave propagation direction.

7. The elastic wave element according to claim 5, wherein the second busbar electrode is disposed in a portion located in the orthogonal or substantially orthogonal direction from the first intersecting electrode finger that is electrically coupled to the reflective electrode finger.

8. The elastic wave element according to claim 1, wherein the reflective electrode finger, the first electrode finger, and the connecting electrode have a same layer structure.

9. The elastic wave element according to claim 8, wherein the connecting electrode extends from the first busbar electrode in the orthogonal or substantially orthogonal direction, and a leading end of the connecting electrode in the orthogonal or substantially orthogonal direction has a round shape.

10. The elastic wave element according to claim 1, wherein the first busbar electrode receives a surge voltage.

11. An elastic wave filter device comprising:
the elastic wave element according to claim 1; and
an input/output terminal; wherein
the input/output terminal is connected to the first busbar electrode of the elastic wave element.

12. The elastic wave filter device according to claim 11, wherein an energization path length between the input/output terminal and the first electrode finger is different from an energization path length between the input/output terminal and the reflective electrode finger.

13. The elastic wave filter device according to claim 11, wherein the connecting electrode is provided in an entirety or substantially an entirety of the in-between area.

14. The elastic wave filter device according to claim 11, wherein
the first electrode finger includes a first intersecting electrode finger;
a second electrode finger among the plurality of second electrode fingers includes a second intersecting electrode finger;
the first intersecting electrode finger and the second intersecting electrode finger intersect each other when viewed in the elastic-wave propagation direction;
the first electrode finger includes a first offset electrode finger disposed opposite to the second intersecting electrode finger in the orthogonal or substantially orthogonal direction;
the second electrode finger includes a second offset electrode finger disposed opposite to the first intersecting electrode finger in the orthogonal or substantially orthogonal direction; and
the connecting electrode is provided between the reflective electrode finger and the first offset electrode finger.

15. The elastic wave filter device according to claim 14, wherein
a first spacing is smaller than a second spacing;
the first spacing is between the reflective electrode finger and the first offset electrode finger;
the reflective electrode finger and the first offset electrode finger are adjacent to each other in the elastic-wave propagation direction;
the second spacing is between the first offset electrode finger and the first intersecting electrode finger; and
the first offset electrode finger and the first intersecting electrode finger are adjacent to each other in the elastic-wave propagation direction.

16. The elastic wave filter device according to claim 11, wherein
the first electrode finger includes a first intersecting electrode finger;
a second electrode finger among the plurality of second electrode fingers includes a second intersecting electrode finger;
the first intersecting electrode finger and the second intersecting electrode finger intersect each other when viewed in the elastic-wave propagation direction;
the first electrode finger includes a first offset electrode finger disposed opposite to the second intersecting electrode finger in the orthogonal or substantially orthogonal direction;
the second electrode finger includes a second offset electrode finger disposed opposite to the first intersecting electrode finger in the orthogonal or substantially orthogonal direction; and
the connecting electrode is provided between the reflective electrode finger and the first intersecting electrode finger.

17. The elastic wave filter device according to claim 16, wherein
a first spacing is smaller than a second spacing;
the first spacing is between the reflective electrode finger and the first offset electrode finger;

the reflective electrode finger and the first offset electrode finger are adjacent to each other in the elastic-wave propagation direction;

the second spacing is between the first offset electrode finger and the first intersecting electrode finger; and the first offset electrode finger and the first intersecting electrode finger are adjacent to each other in the elastic-wave propagation direction.

18. The elastic wave filter device according to claim 16, wherein the second busbar electrode is disposed in a portion located in the orthogonal or substantially orthogonal direction from the first intersecting electrode finger that is electrically coupled to the reflective electrode finger.

19. The elastic wave filter device according to claim 11, wherein the reflective electrode finger, the first electrode finger, and the connecting electrode have a same layer structure.

20. The elastic wave filter device according to claim 19, wherein the connecting electrode extends from the first busbar electrode in the orthogonal or substantially orthogonal direction, and a leading end of the connecting electrode in the orthogonal or substantially orthogonal direction has a round shape.

* * * * *